United States Patent
Du et al.

(10) Patent No.: US 11,514,835 B2
(45) Date of Patent: Nov. 29, 2022

(54) DISPLAY SUBSTRATE HAVING ELECTROSTATIC RING AND CONTROL COMPONENT

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Ruifang Du, Beijing (CN); Xibin Shao, Beijing (CN); Rui Ma, Beijing (CN); Xiaoye Ma, Beijing (CN)

(73) Assignees: BEIJING BOE TECHNOLOGY DEVELOPMENT CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 837 days.

(21) Appl. No.: 16/072,822

(22) PCT Filed: Nov. 29, 2017

(86) PCT No.: PCT/CN2017/113566
§ 371 (c)(1),
(2) Date: Jul. 25, 2018

(87) PCT Pub. No.: WO2018/209922
PCT Pub. Date: Nov. 22, 2018

(65) Prior Publication Data
US 2021/0201749 A1    Jul. 1, 2021

(30) Foreign Application Priority Data

May 19, 2017  (CN) .......................... 201710358989.7

(51) Int. Cl.
*G09G 3/20*    (2006.01)
*H01L 27/12*   (2006.01)
*H01L 27/02*   (2006.01)

(52) U.S. Cl.
CPC ........ *G09G 3/2092* (2013.01); *H01L 27/0288* (2013.01); *H01L 27/124* (2013.01); *G09G 2310/0275* (2013.01)

(58) Field of Classification Search
CPC ......... G02F 1/136286; G02F 1/136204; G02F 1/1368; G02F 1/1362; G02F 1/1345;
(Continued)

(56) References Cited

U.S. PATENT DOCUMENTS 6,515,644 B1 *  2/2003  Kim .................. G02F 1/136204
                                              345/87
2010/0156770 A1 *  6/2010  Shin ..................... G09G 3/3648
                                              345/87
(Continued)

FOREIGN PATENT DOCUMENTS

CN        1845233 A       10/2006
CN      202454227 U   *   9/2012
(Continued)

OTHER PUBLICATIONS

First Chinese Office Action dated Apr. 3, 2018 received for corresponding Chinese Application No. 201710358989.7.
(Continued)

*Primary Examiner* — Xuemei Zheng
(74) *Attorney, Agent, or Firm* — Kinney & Lange, P.A.

(57) ABSTRACT

The present disclosure relates to a display substrate, a method for driving the same, and a display panel. The display substrate includes a base substrate as well as gate lines, data lines and a gate driver on the base substrate, the gate line being connected to the gate driver, and electrostatic
(Continued)

rings and control components corresponding to at least one gate line are further disposed on the base substrate, each of the gate lines being connected to the electrostatic ring by a corresponding control component. The electrostatic ring is configured to load a control voltage to turn on the corresponding control component after the display panel is turned off, and the corresponding control component is configured to be turned on to change a voltage on the gate line into a turn-on voltage after the display panel is turned off.

16 Claims, 2 Drawing Sheets

(58) Field of Classification Search
CPC .......... G02F 1/136254; G02F 2202/22; G09G 3/3266; G09G 3/3275; G09G 3/3677; G09G 2330/027; G09G 2320/0257; G09G 3/2092; G09G 2310/0275; H01L 27/0288; H01L 27/124

See application file for complete search history.

(56) References Cited

U.S. PATENT DOCUMENTS

2015/0348507 A1* 12/2015 Zhang .................. G09G 5/18
    345/213
2016/0027372 A1* 1/2016 Yan .................... H01L 27/0296
    345/211

FOREIGN PATENT DOCUMENTS

| CN | 202454227 U | | 9/2012 |
| CN | 202473180 U | * | 10/2012 |
| CN | 202473180 U | | 10/2012 |
| CN | 104051455 A | | 9/2014 |
| CN | 204667021 U | | 9/2015 |
| CN | 106990633 A | | 7/2017 |

OTHER PUBLICATIONS

Second Chinese Office Action dated Oct. 25, 2018 received for corresponding Chinese Application No. 201710358989.7.
International Search Report and English translation of Box V of the Written Opinion dated Feb. 26, 2018 received tor corresponding PCT/CN2017/113566.

* cited by examiner

DISPLAY SUBSTRATE HAVING ELECTROSTATIC RING AND CONTROL COMPONENT

CROSS-REFERENCE TO RELATED APPLICATION(S)

This application is the national phase of PCT Application No. PCT/CN2017/113566 filed on Nov. 29, 2017, which in turn claims the benefit of Chinese Patent Application No. 201710358989.7 filed on May 19, 2017 in the State Intellectual Property Office of China, the whole disclosure of which is incorporated herein by reference.

BACKGROUND

Technical Field

The present disclosure relates to the field of display technologies, and in particular to a display substrate, a method for driving the same, and a display panel.

Description of the Related Art

In order to solve a problem of shutdown residual image, a display product usually starts a Xao function after being shutdown, that is, voltages of all the gate lines are set to a high level, at this time, thin film transistors (abbreviated as TFT) for all sub-pixels in a display panel thereof are turned on and discharge towards their respective pixel electrodes. An output end of a conventional gate driver on array (abbreviated as GOA) is directly connected to a corresponding gate line. When the Xao function is turned on, the gate line is loaded with a high level through a signal line of the GOA. At this time, the signal line of the GOA and the gate line are both at a high level, thereby charges inside the GOA are accumulated, so that a corresponding TFT is in a stressed state, which reduces the reliability of the GOA.

SUMMARY

According to an aspect of the present disclosure, there is provided a display substrate, comprising a base substrate, as well as gate lines and gate drivers on array on the base substrate, the gate lines being connected to the gate drivers on array, wherein electrostatic rings and control components corresponding to at least one gate line are disposed on the base substrate, and the at least one gate line is connected to the electrostatic rings through corresponding control components. In an embodiment, each of the electrostatic rings is configured to load a control voltage after the display panel is turned off, so as to turn on a corresponding one of the control components;

each of the control components is configured to be turned on after the display panel is turned off, so as to change a voltage on a corresponding gate line into a turn-on voltage.

In an embodiment, the display substrate is provided with a display region and a peripheral region around the display region, the gate drivers on array, the electrostatic rings, and the control components being located in the peripheral region.

In an embodiment, the number of the gate drivers on array is two, and the two gate drivers on array are located on either side of the display region; the number of the electrostatic rings is two, and the two electrostatic rings are located on either side of the display region; each of the gate lines is configured to be corresponding to two control elements, and the two control components are located on either side of the display region;

each of the control components connects an electrostatic ring on the same side of the display region to a corresponding gate line.

In an embodiment, each of the control component comprises an electrostatic resistor, a first end of the electrostatic resistor being connected to a corresponding gate line, and a second end of the electrostatic resistor being connected to the electrostatic ring on the same side of the display region.

In an embodiment, the electrostatic ring is configured to load a control voltage to the second end of the electrostatic resistor after the display panel is turned off, so as to cause the electrostatic resistor to be turned on to change a voltage on the gate line into a turn-on voltage.

In an embodiment, the electrostatic ring is further configured to ground the second end of the electrostatic resistor when the display panel is working;

the electrostatic resistor is further configured to discharge static electricity on the gate line through the electrostatic ring.

In an embodiment, each of the control components comprises a switch transistor, and the electrostatic ring comprises a first sub-electrostatic ring and a second sub-electrostatic ring, a control electrode of the switch transistor being connected to the first sub-electrostatic ring, a first electrode of the switch transistor being connected to the gate line, and a second electrode of the switch transistor being connected to the second sub-electrostatic ring.

In an embodiment, the control voltage comprises a first control sub-voltage and a second control sub-voltage;

the first sub-electrostatic ring is configured to load a first control sub-voltage to the control electrode of the switch transistor to turn on the switch transistor after the display panel is turned off;

the second sub-electrostatic ring is configured to load a second control sub-voltage to the second electrode of the switch transistor after the display panel is turned off;

the switch transistor is configured to be turned on in after the display panel is turned off to change a voltage on the gate line into a turn-on voltage.

In an embodiment, each of the control components comprises an electrostatic resistor and a switch transistor, and the electrostatic ring comprises a first sub-electrostatic ring and a second sub-electrostatic ring, a first end of the electrostatic resistor being connected to a corresponding gate line, a second end of the electrostatic resistor being connected to the second sub-electrostatic ring, a control electrode of the switch transistor being connected to the first sub-electrostatic ring, a first electrode of the switch transistor being connected to the gate line, and a second electrode of the switch transistor being connected to the second sub-electrostatic ring.

In an embodiment, the control voltage comprises a first control sub-voltage and a second control sub-voltage;

the first sub-electrostatic ring is configured to load a first control sub-voltage to a control electrode of the switch transistor after the display panel is turned off to turn on the switch transistor;

the second sub-electrostatic ring is configured to load a second control sub-voltage to the second electrode of the switch transistor and to load the second control sub-voltage to the second end of the electrostatic resistor to turn on the electrostatic resistor after the display panel is turned off;

the switch transistor and the electrostatic resistor are configured to be turned on after the display panel is turned off, so as to change a voltage on the gate line into a turn-on voltage.

In an embodiment, the control voltage is at a high level and the turn-on voltage is at a high level.

In an embodiment, the first control sub-voltage is at a high level, the second control sub-voltage is at a high level, and the turn-on voltage is at a high level.

According to another aspect of the present disclosure, there is provided a display panel comprising above display substrate and an opposite substrate being oppositely disposed.

According to another aspect of the present disclosure, there is provided a method for driving above display substrate, comprising the following steps:

the electrostatic ring loading a control voltage after the display panel is turned off, so as to turn on the corresponding control component;

turning on the corresponding control component to change a voltage on the gate line into a turn-on voltage after the display panel is turned off.

According to another aspect of the present disclosure, there is provided a method for driving above display substrate, comprising the following steps:

the first sub-electrostatic ring loading a first control sub-voltage to the control electrode of the switch transistor after the display panel is turned off, so as to turn on the switch transistor;

the second sub-electrostatic ring loading a second control sub-voltage to the second electrode of the switch transistor after the display panel is turned off;

turning on the switch transistor to change a voltage on the gate line into a turn-on voltage after the display panel is turned off.

According to another aspect of the present disclosure, there is provided a method for driving above display substrate, comprising the following steps:

the first sub-electrostatic ring loading a first control sub-voltage to the control electrode of the switch transistor after the display panel is turned off, so as to turn on the switch transistor;

the second sub-electrostatic ring loading a second control sub-voltage to the second electrode of the switch transistor and loading a second control sub-voltage to the second end of the electrostatic resistor after the display panel is turned off, so as to turn on the electrostatic resistor;

turning on the switch transistor and the electrostatic resistor to change a voltage on the gate line into a turn-on voltage after the display panel is turned off.

DETAILED DESCRIPTION

In order to enable those skilled in the art to better understand the technical solutions of the present disclosure, the display substrate and the method for driving the same and the display panel provided by the present disclosure are described in detail below with reference to the accompanying drawings.

According to an inventive concept of the present disclosure, there is provided a display substrate which includes a base substrate as well as gate lines, data lines and a gate driver on the base substrate, the gate line being connected to the gate driver, and electrostatic rings and control components corresponding to at least one gate line are further disposed on the base substrate, each of gate lines being connected to the electrostatic ring by a corresponding control component; the electrostatic ring is configured to load a control voltage to turn on the corresponding control component after the display panel is turned off; the corresponding control component is configured to be turned on to change a voltage on the gate line into a turn-on voltage after the display panel is turned off.

Figure 1:
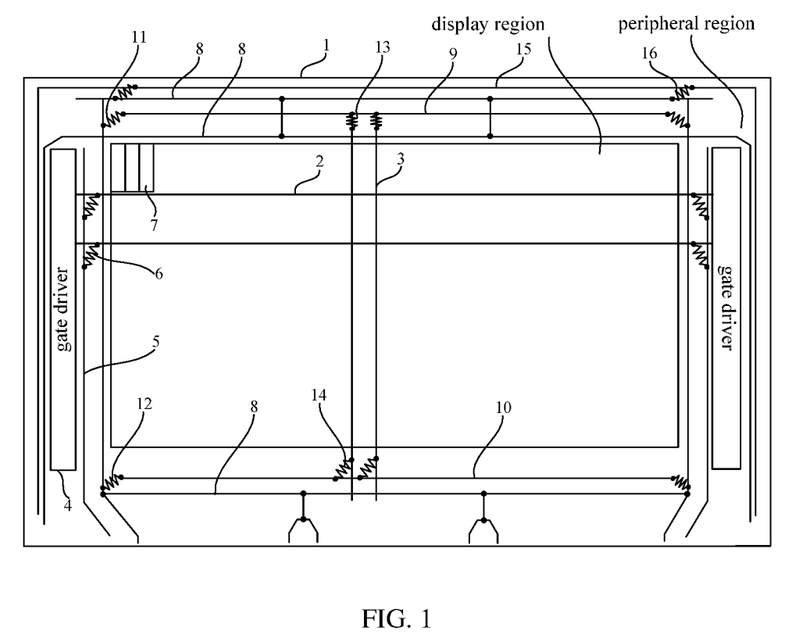
FIG. 1 is a schematic structural view of a display substrate according to an embodiment of the present disclosure.

FIG. 1 is a schematic structural view of a display substrate according to an embodiment of the present disclosure. As shown in FIG. 1, the display substrate includes a base substrate 1, as well as gate lines 2, data lines 3, and gate drivers 4 on the base substrate 1. The gate lines 2 are connected to the gate drivers 4, and the base substrate 1 is further provided with electrostatic rings 5 and control components, each control component being provided corresponding to each of the gate lines 2. Each of the gate lines 2 is connected to a corresponding electrostatic ring 5 through a corresponding control component. Each electrostatic ring 5 is configured to load a control voltage after the display panel is turned off, so as to turn on the corresponding control component. Each control component is configured to be turned on after the display panel is turned off, so as to change a voltage on corresponding gate line 2 into a turn-on voltage.

In this embodiment, the display substrate is provided with a display region and a peripheral region around the display region, and the gate drivers 4, the electrostatic rings 5, and the control components are located in the peripheral region.

Optionally, the number of the gate drivers 4 is two, and the two gate drivers 4 are located on either side of the display region. Each of gate lines 2 is connected to two gate drivers 4. In this embodiment, two gate drivers 4 are employed to realize a bilateral simultaneous driving, especially for a large-sized display panel with a relatively large internal load, which enables gate lines 2 reach a set charging rate. The number of the electrostatic rings 5 is two, and the two electrostatic rings 5 are located on either side of the display region. The number of control components corresponding to each gate line 2 is two, and the two control components are located on either side of the display region. Each of the control components connects the corresponding gate line 2 to a corresponding one of the electrostatic rings 5 located on a same side of the display region. As shown in FIG. 1, one gate driver 4 and one electrostatic ring 5 are located on a left side of the display region, and the other gate driver 4 and the other electrostatic ring 5 are located on a right side of the display region. In the two control components corresponding to each gate line, one control component is located on the left side of the display region and the other control component is located on the right side of the display region.

In this embodiment, the control component includes an Electro-Static discharge (abbreviated as ESD) 6, the electrostatic resistor 6 is connected at a first end thereof to a corresponding gate line 2, and connected at a second end thereof to a corresponding electrostatic ring 5. The corresponding electrostatic ring 5 is configured to load a control voltage to the second end of the electrostatic resistor 6 after the display panel is turned off, so as to turn on the electrostatic resistor 6. The electrostatic resistor 6 is configured to be turned on after the display panel is turned off so that the voltage on the gate line 2 is the turn-on voltage. In this embodiment, optionally, the number of the electrostatic resistors 6 corresponding to each of the gate lines 2 is two, and the two electrostatic resistors 6 are located on either side of the display region, specifically, an electrostatic resistor 6 is located on the left side of the display region, the other electrostatic resistor 6 is located on the right side of the display region. Each electrostatic resistor 6 is connected to a respective electrostatic ring 5 on the same side of the display region. Specifically, the second end of each electrostatic resistor 6 located on the left side of the display region is connected to a corresponding electrostatic ring 5 located on the left side of the display region; the second end of the electrostatic resistor 6 located on the right side of the display region is connected to another corresponding electrostatic ring 5 located on the right side of the display region.

In an alternative embodiment, the electrostatic rings 5 may also be connected to a printed circuit board (abbreviated as PCB) through a chip on flex (or chip on film, (abbreviated as COF).

Further, each electrostatic ring 5 is configured to ground the second end of the corresponding electrostatic resistor 6 when the display panel is working; the corresponding electrostatic resistor 6 is also configured to discharge static electricity on corresponding gate line 2 through the electrostatic ring 5.

In the present embodiment, a plurality of gate lines 2 and a plurality of data lines 3 intersect each other to define pixel units 7. In an alternative embodiment, each of the pixel units 7 includes a thin film transistor and a pixel electrode connected to the thin film transistor. It should be noted that, in FIG. 1, only two gate lines 2 and two data lines 3 are taken as an example for description; in FIG. 1, only three pixel units 7 are taken as an example, which may also be conceived to be equivalent to three sub-pixel units forming one pixel collectively, and the three sub-pixel units may be respectively disposed corresponding to a red color resistance, a green color resistance and a blue color resistance of a color filter substrate.

Further, the display substrate further includes a common electrode line 8, an electrostatic ring 9 and an electrostatic ring 10 on the base substrate 1. The common electrode line 8, the electrostatic ring 9 and the electrostatic ring 10 are all located in the peripheral region. The common electrode line 8 is disposed around the display region, the electrostatic ring 9 is located above the display region, and the electrostatic ring 10 is located below the display region. The common electrode line 8 is connected to the electrostatic ring 9 through an electrostatic resistor 11, and the common electrode line 8 is connected to the electrostatic ring 10 through another electrostatic resistor 12. Each data line 3 is connected to the electrostatic ring 9 through the electrostatic resistor 13, and connected to the electrostatic ring 10 through the electrostatic resistor 14. Further, the display substrate further includes a ground line 15 on the base substrate 1, and the ground line 15 is located in the peripheral region, and the common electrode line 8 is connected to the ground line 15 through still another electrostatic resistor 16. In this embodiment, the data line(s) 3, the common electrode line 8, the electrostatic ring 9, the electrostatic ring 10 and the ground line 15 may all be connected to the COF to achieve connections to the PCB through the COF.

In this embodiment, the display substrate may be an array substrate.

The operation of the display panel including the display substrate of the present embodiment will be described in detail below with reference to FIG. 1.

After the display panel is turned off, it is in a non-working state, and a control voltage is loaded to the corresponding electrostatic ring(s) 5 to achieve loading the control voltage to the second end of the electrostatic resistor(s) 6. At this time, the control voltage is at a high level, as the voltage at the first end of the electrostatic resistor(s) 6 is at a low level and the voltage at the second end of the electrostatic resistor(s) 6 is at a high level, so the electrostatic resistor(s) 6 may be turned on. Then, the electrostatic rings 5 may load a turn-on voltage to the gate lines 2 through the turned-on electrostatic resistor(s) 6, which voltage is at a high level, so that the voltage at the gate line 2 is set to a high level. With the above method, the voltages of all the gate lines 2 on the display panel 2 are all set to a high level, so that the TFTs of all the sub-pixels are turned on to discharge static electricity on the pixel electrodes, thereby realizing the Xao function.

After the display panel is turned on, it is in a working state, and each gate driver 4 outputs a GOA output signal to the gate lines 2, and the display region performs displaying. The electrostatic rings 5 are grounded, that is, the voltage at the electrostatic rings 5 is set to GND, so that the second end of the electrostatic resistor(s) 6 may be grounded. When the static electricity is generated on the gate lines 2, the voltage on the gate lines 2 is at a high level, so the electrostatic resistor(s) 6 may be turned on. The gate line 2 may discharge static electricity through the turned-on electrostatic resistor(s) 6 and the electrostatic ring(s) 5, thereby preventing the static electricity of the gate lines 2 from damaging the gate drivers.

In the technical solution of the display substrate provided in this embodiment, electrostatic rings and control components corresponding to at least one gate line are further disposed on the base substrate, and each of the gate lines is connected to the corresponding electrostatic ring through a corresponding control component. The electrostatic ring is loaded a control voltage to turn on the corresponding control component after the display panel is turned off, and the corresponding control component is turned on after the display panel is turned off to change the voltage on the gate line into a turn-on voltage. In this embodiment, the electrostatic ring(s) may load a voltage to the gate lines through the control component(s) to implement the Xao function, without loading a voltage to the gate lines by the gate driver(s), thereby avoiding charge accumulation inside the gate driver(s), and thereby improving the reliability of the gate driver(s). In this embodiment, each control component is an electrostatic resistor, and the electrostatic resistor may discharge static electricity on the gate lines through the electrostatic rings when the display panel is working, thereby preventing the static electricity of the gate lines from damaging the gate driver(s). In this embodiment, the control component(s) and the electrostatic ring(s) are respectively disposed on either side of the gate line, so that the Xao function and the electrostatic discharge function may be better realized.

Figure 2:
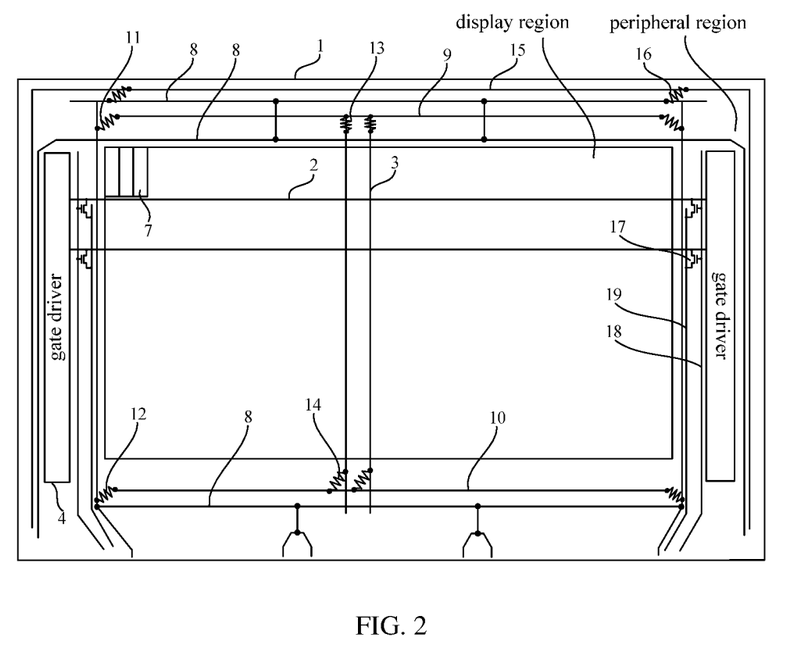
FIG. 2 is a schematic structural view of a display substrate according to another embodiment of the present disclosure.

FIG. 2 is a schematic structural view of a display substrate according to another embodiment of the present disclosure. As shown in FIG. 2, the display substrate includes a base substrate 1, as well as gate lines 2, data lines 3, and gate drivers 4 on the base substrate 1. The gate lines 2 and the gate drivers 4 are connected to each other, and the base substrate 1 is further provided with electrostatic rings and control components corresponding to each of the gate lines 2. Each of the gate lines 2 is connected with an electrostatic ring through a corresponding control component. Each electrostatic ring is configured to load the control voltage after the display panel is turned off, so as to turn on the corresponding control component. Each control component is configured to be turned on after the display panel is turned off, so as to change the voltage on the gate line 2 into the turn-on voltage.

In this embodiment, the display substrate is provided with a display region and a peripheral region around the display region. The gate drivers 4, the electrostatic rings and the control components are located in the peripheral region.

Optionally, the number of the gate drivers 4 is two, and the two gate drivers 4 are located on either side of the display region. Each of the gate lines 2 is connected to two gate drivers 4. In this embodiment, two gate drivers 4 are employed to realize a bilateral simultaneous driving, especially for a large-sized display panel with a relatively large internal load, which enables gate lines 2 to reach a set charging rate. The number of the electrostatic rings is two, and the two electrostatic rings are respectively located on either side of the display region. The number of control components corresponding to each gate line 2 is two, and the two control components are respectively located on either side of the display region. Each of the control components is connected to a corresponding gate line 2 and a corresponding one of the electrostatic rings located on the same side of the display region. As shown in FIG. 2, one gate driver 4 and one electrostatic ring are located on a left side of the display region, and the other gate driver 4 and the other electrostatic ring are located on a right side of the display region; in two control components corresponding to each gate line, one control component is located on the left side of the display region, and the other control component is located on the right side of the display region.

In this embodiment, each control component includes a switch transistor 17, and each electrostatic ring includes a first sub-static ring 18 and a second sub-static ring 19. A control electrode of the switch transistor 17 is connected to the first sub-static ring 18, a first electrode of the switch transistor 17 is connected to a corresponding gate line 2, and a second electrode of the switch transistor 17 is connected to the second sub-electrostatic ring 19. The control voltage includes a first control sub-voltage and a second control sub-voltage. Each first sub-electrostatic ring 18 is configured to load a first control sub-voltage to the control electrode of the corresponding switch transistor 17 after the display panel is turned off, so as to turn on the switch transistor 17. Each second sub-electrostatic ring 19 is configured to load a second control sub-voltage to the second electrode of the corresponding switch transistor 17 after the display panel is turned off. Each switch transistor 17 is configured to be turned on after the display panel is turned off so that the voltage on the corresponding gate line 2 is the turn-on voltage. In this embodiment, optionally, the number of the switch transistors 17 corresponding to each of the gate lines 2 is two, and the two switch transistors 17 are located on either side of the display region respectively. Specifically, one switch transistor 17 is located on the left side of the display region, and the other switch transistor 17 is located on the right side of the display region. Each switch transistor 17 is connected to the corresponding first sub-electrostatic ring 18 and the corresponding second sub-electrostatic ring 19 on the same side of the display region. Specifically, the control electrode of each switch transistor 17 located on the left side of the display region is connected to the corresponding first electrostatic ring 18 located on the left side of the display region, and the second electrode of each switch transistor 17 located on the left side of the display region is connected to the corresponding second sub-electrostatic ring 19 located on the left side of the display region; the control electrode of each switch transistor 17 located on the right side of the display region is connected to the corresponding first sub-electrostatic ring 18 located on the right side of the display region, and the second electrode of each switch transistor 17 located on the right side of the display region is connected to the corresponding second sub-electrostatic ring 19 located on the right side of the display region.

In an alternative embodiment, the first sub-electrostatic ring(s) 18 and the second sub-electrostatic ring(s) 19 are further connected to a printed circuit board (abbreviated as PCB) through a Chip On Flex (or Chip On Film, abbreviated as COF).

In this embodiment, a plurality of gate lines 2 and a plurality of data lines 3 intersect each other to define pixel units 7. In an alternative embodiment, each of the pixel units 7 includes a thin film transistor and a pixel electrode connected to the thin film transistor. It should be noted that, in FIG. 2, only two gate lines 2 and two data lines 3 are taken as an example for description; in FIG. 2, only three pixel units 7 are taken as an example, which may also be conceived to be equivalent to three sub-pixel units forming one pixel collectively, and the three sub-pixel units may be respectively disposed corresponding to a red color resistance, a green color resistance and a blue color resistance of the color filter substrate.

Further, the display substrate includes a common electrode line 8, an electrostatic ring 9 and an electrostatic ring 10 on the base substrate 1. The common electrode line 8, the electrostatic ring 9 and the electrostatic ring 10 are all located in the peripheral region. The common electrode line 8 is disposed around the display region, the electrostatic ring 9 is located above the display region, and the electrostatic ring 10 is located below the display region. The common electrode line 8 is connected to the electrostatic ring 9 through an electrostatic resistor 11, and the common electrode line 8 is connected to the electrostatic ring 10 through another electrostatic resistor 12. Each data line 3 is connected to the electrostatic ring 9 through the electrostatic resistor 13, and connected to the electrostatic ring 10 through the electrostatic resistor 14. Further, the display substrate further includes a ground line 15 on the base substrate 1, and the ground line 15 is located in the peripheral region, and the common electrode line 8 is connected to the ground line 15 through still another electrostatic resistor 16. In this embodiment, the data line(s) 3, the common electrode line 8, the electrostatic ring 9, the electrostatic ring 10 and the ground line 15 may all be connected to the COF to achieve connection to the PCB through the COF.

In this embodiment, the switch transistor 17 may be a TFT. The TFT is used as the switch transistor 17, and then the TFT may be formed simultaneously in manufacturing processes of the display panel without adding any new process, thereby reducing the manufacturing cost.

In this embodiment, the display substrate may be an array substrate.

The operation of the display panel including the display substrate of the present embodiment will be described in detail below with reference to FIG. 2.

After the display panel is turned off, it is in a non-working state, the first control sub-voltage is loaded to each first sub-electrostatic ring 18 to load the first control sub-voltage to the control electrode of a corresponding switch transistor 17, and at this time, the first control sub-voltage is at a high level. Each switch transistor 17 is turned on under a control of the first control sub-voltage. Each second sub-electrostatic ring 19 is loaded with a second control sub-voltage, and thus loads a turn-on voltage on the corresponding gate line(s) 2 through a corresponding turned-on switch transistor 17, and the second control sub-voltage is at a high level, so the turn-on voltage is at a high level, such that the voltage at the corresponding gate line(s) 2 is set to a high level. With the above method, the voltages at all the gate lines 2 on the display panel 2 are all set to a high level, so that the TFTs of all the sub-pixels are turned on to discharge the pixel electrodes, thereby realizing the Xao function. By controlling the second control sub-voltage loaded on the second sub-electrostatic ring(s) 19, the voltage value of the turn-on voltage on the gate line 2 when the Xao function is realized is controlled, and the voltage on the gate line(s) 2 is controllable when the Xao function is realized.

After the display panel is turned on, it is in a working state. The first control sub-voltage loaded by each first sub-electrostatic ring 18 is at a low level, and the second control sub-voltage loaded by each second sub-electrostatic ring 19 is at a low level, so that a corresponding switch transistor 17 is turned off. At this time, a corresponding gate driver 4 outputs a GOA output signal to the gate line 2, and the display region performs displaying.

In the technical solution of the display substrate provided in this embodiment, an electrostatic ring and a control component corresponding to at least one gate line are further disposed on the base substrate, and each of the gate lines is connected to the corresponding electrostatic ring through a corresponding control component, and the electrostatic ring loads the control voltage after the display panel is turned off to turn on the corresponding control component, and the corresponding control component is turned on after the display panel is turned off to change the voltage on the gate line into the turn-on voltage. In this embodiment, the electrostatic ring(s) may load a voltage to the gate lines through the control component(s) to implement the Xao function, without loading a voltage to the gate lines by the gate driver(s), thereby avoiding charge accumulation inside the gate driver(s), and thereby improving the reliability of the gate driver(s). In this embodiment, each control component includes a switch transistor, and each electrostatic ring includes a first sub-electrostatic ring and a second sub-electrostatic ring. The second control sub-voltage loaded on the second sub-electrostatic ring is controlled to realize the Xao function and the voltage on the gate line is controllable. In this embodiment, the control components and the electrostatic rings are disposed on both sides of the gate line, so that the Xao function may be better realized. In this embodiment, as the TFTs are used as the switch transistors 17, and the TFTs may be formed simultaneously in manufacturing processes of the display panel without any new manufacturing process, thereby reducing the manufacturing cost.

Yet another embodiment of the present disclosure provides a display substrate including a base substrate, as well as gate lines, data lines, and gate drivers on the base substrate, the gate lines and the gate drivers are connected to each other. Electrostatic rings and control components corresponding to at least one gate line are further disposed on the base substrate, and each of the gate lines is connected with an electrostatic ring through a corresponding control component. Each electrostatic ring is configured to load the control voltage after the display panel is turned off, so as to turn on the corresponding control component. Each control component is configured to be turned on after the display panel is turned off, so as to change the voltage on the gate lines into the turn-on voltage. Each control component comprises an electrostatic resistor and a switch transistor, and each electrostatic ring comprises a first sub-electrostatic ring and a second sub-static ring. The first end of each electrostatic resistor is connected to the corresponding gate line, and the second end of each electrostatic resistor is connected to the corresponding second sub-electrostatic ring. The control electrode of the switch transistor is connected to the corresponding first sub-electrostatic ring, the first electrode of each switch transistor is connected to the corresponding gate line, and the second electrode of each switch transistor is connected to the corresponding second sub-electrostatic ring.

In this embodiment, the control voltage includes a first control sub-voltage and a second control sub-voltage. Each first sub-electrostatic ring is configured to load a first control sub-voltage to a control electrode of the corresponding switch transistor to enable such a switch transistor to be turned on after the display panel is turned off; and each second sub-electrostatic ring is configured to load a second control sub-voltage to a second electrode of the corresponding switch transistor after the display panel is turned off and to load a second control sub-voltage to the second end of the corresponding electrostatic resistor to turn on the corresponding electrostatic resistor; each switch transistor and the corresponding electrostatic resistor are configured to be turned on after the display panel is turned off so that the voltage on the corresponding gate line(s) is changed into the turn-on voltage.

Further, each second sub-electrostatic ring is further configured to ground the second end of the corresponding electrostatic resistor when the display is working; the corresponding electrostatic resistor is further configured to discharge the static electricity on the corresponding gate line(s) through the second sub-electrostatic ring.

In this embodiment, the display panel is in the working state after being turned on. At this time, the voltage loaded by each first sub-electrostatic ring is a low level, and such a low level may be a negative voltage, so that the corresponding switch transistor may be turned off. The voltage at each second sub-electrostatic ring may be GND, that is, such a second sub-electrostatic ring is grounded, so that the corresponding electrostatic resistor discharges the static electricity on the corresponding gate line(s) through the second sub-electrostatic ring.

The technical solution of the display substrate provided by this embodiment is a technical solution combining the above two embodiments. Therefore, the description concerning the structures and operation principles of the electrostatic resistor(s), the switch transistor(s), the first sub-electrostatic ring(s) and the second sub-electrostatic ring(s) may be referred to the above embodiments, which are not described in detail herein.

In the technical solution of the display substrate provided in this embodiment, an electrostatic ring and a control component corresponding to at least one gate line are further disposed on the base substrate. Each of the gate lines is connected to the corresponding electrostatic ring through a corresponding control component, and the electrostatic ring loads the control voltage after the display panel is turned off to turn on the corresponding control component, and the corresponding control component is turned on after the display panel is turned off to change the voltage on the gate line into the turn-on voltage. In this embodiment, the electrostatic ring(s) may load a voltage to the gate lines through the control component(s) to implement the Xao function, without loading a voltage to the gate lines by the gate driver(s), thereby avoiding charge accumulation inside the gate driver(s), and thereby improving the reliability of the gate driver(s).

The embodiment of the present disclosure further provides a display panel including a display substrate and an opposite substrate disposed opposite to each other, and the display substrate may be the display substrate of the above embodiment.

In this embodiment, the display substrate is an array substrate, and the opposite substrate is a color film substrate.

In the technical solution of the display panel provided by the embodiment, the base substrate is further provided with an electrostatic ring and a control component corresponding to the at least one gate line, and each of the gate lines is connected to the corresponding electrostatic ring through a corresponding control component, and the electrostatic ring loads the control voltage after the display panel is turned off to turn on the corresponding control component, and the corresponding control component is turned on after the display panel is turned off to change the voltage on the gate line into the turn-on voltage. In this embodiment, the electrostatic ring(s) may load a voltage to the gate lines through the control component(s) to implement the Xao function, without loading a voltage to the gate lines by the gate driver(s), thereby avoiding charge accumulation inside the gate driver(s), and thereby improving the reliability of the gate driver(s).

Embodiments of the present disclosure also provide a method for driving a display substrate including a base substrate as well as gate lines, data lines, and gate drivers on the base substrate. The gate lines are connected to the gate drivers, and the base substrate is further provided with electrostatic rings and control components corresponding to the at least one gate line, and each of the gate lines is connected to the corresponding electrostatic ring through a corresponding control component;

The method includes:

the electrostatic ring loading a control voltage after the display panel is turned off, so as to turn on the corresponding control component;

turning on the corresponding control component to change a voltage on the corresponding gate line into a turn-on voltage after the display panel is turned off.

Embodiments of the present disclosure also provide a method for driving the display substrate in which each of the control components comprises a switch transistor, and the electrostatic ring comprises a first sub-electrostatic ring and a second sub-electrostatic ring, a control electrode of the switch transistor being connected to the first sub-electrostatic ring, a first electrode of the switch transistor being connected to the gate line, and a second electrode of the switch transistor being connected to the second sub-electrostatic ring, The method includes:

the first sub-electrostatic ring loading a first control sub-voltage to the control electrode of the switch transistor after the display panel is turned off, so as to turn on the switch transistor;

the second sub-electrostatic ring loading a second control sub-voltage to the second electrode of the switch transistor after the display panel is turned off;

turning on the switch transistor to change a voltage on the gate line into a turn-on voltage after the display panel is turned off.

Embodiments of the present disclosure also provide a method for driving the display substrate, in which each of the control components comprises an electrostatic resistor and a switch transistor, and the electrostatic ring comprises a first sub-electrostatic ring and a second sub-electrostatic ring, a first end of the electrostatic resistor being connected to a corresponding gate line, a second end of the electrostatic resistor being connected to the second sub-electrostatic ring, a control electrode of the switch transistor being connected to the first sub-electrostatic ring, a first electrode of the switch transistor being connected to the gate line, and a second electrode of the switch transistor being connected to the second sub-electrostatic ring, The method includes:

the first sub-electrostatic ring loading a first control sub-voltage to the control electrode of the switch transistor after the display panel is turned off, so as to turn on the switch transistor;

the second sub-electrostatic ring loading a second control sub-voltage to the second electrode of the switch transistor and loading a second control sub-voltage to the second end of the electrostatic resistor after the display panel is turned off, so as to turn on the electrostatic resistor;

turning on the switch transistor and the electrostatic resistor to change a voltage on the gate line into a turn-on voltage after the display panel is turned off.

In the technical solution of the method for driving the display substrate provided by the embodiment, the base substrate is further provided with electrostatic rings and control components corresponding to the at least one gate line. Each of the gate lines is connected to the corresponding electrostatic ring through a corresponding control component, and the electrostatic rings load the control voltage after the display panel is turned off to turn on the corresponding control components, and the corresponding control components are turned on after the display panel is turned off to change the voltage on the gate line into the turn-on voltage. In this embodiment, the electrostatic ring(s) may load a voltage to the gate lines through the control component(s) to realize the Xao function without loading a voltage to the gate lines by the gate driver(s), thereby avoiding charge accumulation inside the gate driver(s), and thereby improving the reliability of the gate driver(s).

It is to be understood that the above embodiments are merely exemplary embodiments employed to explain the principles of the present disclosure. However, the present disclosure is not limited thereto. Various modifications and improvements may be made by those skilled in the art without departing from the spirit and scope of the disclosure, and such modifications and improvements are also considered to be within the scope of the disclosure.

What is claimed is:

1. A display substrate, comprising:
a base substrate;
gate lines, data lines, a common electrode line and gate drivers on array on the base substrate, the gate lines being connected to the gate drivers on array;
electrostatic rings disposed on the base substrate, wherein the electrostatic rings comprise two first electrostatic rings respectively arranged around opposite ends of the gate lines and at least one second electrostatic ring which is perpendicular to and separated from the two first electrostatic rings; and
control components disposed on the base substrate and comprising first control components, second control components and third control components, wherein the gate lines are connected to the two first electrostatic rings through the first control components, the data lines are connected to the at least one second electrostatic ring through the second control components, and the common electrode line is connected to the at least one second electrostatic ring through the third control components, wherein each of the gate lines is connected to the two first electrostatic rings through two of the first control components, and each of the two first electrostatic rings is configured to load a control voltage after the display panel is turned off, so as to turn on the first control components connected to the each of the two first electrostatic rings.

2. The display substrate according to claim 1, wherein:
each of the first control components is configured to be turned on after the display panel is turned off, so as to change a voltage on a corresponding gate line into a turn-on voltage.

3. The display substrate according to claim 2, wherein each of the two first electrostatic rings comprises a first sub-electrostatic ring and a second sub-electrostatic ring, each of the first control components connected to each first electrostatic ring comprises a switch transistor having a control electrode being connected to the first sub-electrostatic ring of the each first electrostatic ring, a first electrode being connected to a corresponding gate line, and a second electrode being connected to the second sub-electrostatic ring of the each first electrostatic ring.

4. The display substrate according to claim 3, wherein the control voltage comprises a first control sub-voltage and a second control sub-voltage;
each first sub-electrostatic ring is configured to load the first control sub-voltage to the control electrodes of the switch transistors connected to the each first sub-electrostatic ring to turn on the switch transistors after the display panel is turned off;
each second sub-electrostatic ring is configured to load the second control sub-voltage to the second electrodes of the switch transistors connected to the each second sub-electrostatic ring after the display panel is turned off; and
each switch transistor is configured to be turned on after the display panel is turned off so as to change a voltage on a corresponding gate line connected to the first electrode of the each switch transistor into a turn-on voltage.

5. The display substrate according to claim 4, wherein the first control sub-voltage is at a high level, the second control sub-voltage is at a high level, and the turn-on voltage is at a high level.

6. A method for driving the display substrate according to claim 3, comprising the following steps:
each first sub-electrostatic ring loading a first control sub-voltage to the control electrodes of the switch transistors connected to the each first sub-electrostatic ring after the display panel is turned off, so as to turn on the switch transistors;
each second sub-electrostatic ring loading a second control sub-voltage to the second electrodes of the switch transistors connected to the each second sub-electrostatic ring after the display panel is turned off;
turning on each switch transistor to change a voltage on a corresponding gate line connected to the first electrode of the each switch transistor into a turn-on voltage after the display panel is turned off.

7. The display substrate according to claim 1, wherein the display substrate is provided with a display region and a peripheral region around the display region, the gate drivers on array, the electrostatic rings, and the control components being located in the peripheral region.

8. The display substrate according to claim 7, wherein a number of the gate drivers on array is two, and the gate drivers on array are located on opposite sides of the display region; the two first electrostatic rings are located on opposite sides of the display region; the two of the first control components corresponding to each of the gate lines are located on opposite sides of the display region; and
each of the first control components connects one of the two first electrostatic rings on a same side of the display region to a corresponding one of the gate lines.

9. The display substrate according to claim 1, wherein each of the first control components comprises an electrostatic resistor, a first end of the electrostatic resistor being connected to a corresponding gate line, and a second end of the electrostatic resistor being connected to a corresponding electrostatic ring.

10. The display substrate according to claim 9, wherein each of the two first electrostatic rings is configured to load a control voltage to the second ends of the electrostatic resistors connected to the each of the two first electrostatic rings after the display panel is turned off, so as to cause each of the electrostatic resistors connected to the each of the two first electrostatic rings to be turned on to change a voltage on a corresponding gate line connected to the first end of the each of the electrostatic resistors into a turn-on voltage.

11. The display substrate according to claim 10, wherein each of the two first electrostatic rings is further configured to ground the second ends of the electrostatic resistors connected to the each of the two first electrostatic rings when the display panel is working; and
each of the electrostatic resistors connected to the each of the two first electrostatic rings is further configured to discharge static electricity on the corresponding gate line connected to the first end of the each of the electrostatic resistors through the each of the two first electrostatic rings.

12. The display substrate according to claim 10, wherein the control voltage is at a high level and the turn-on voltage is at a high level.

13. The display substrate according to claim 1,
wherein each of the two first electrostatic rings comprises a first sub-electrostatic ring and a second sub-electrostatic ring, and wherein each of the first control components comprises a switch transistor and an electrostatic resistor;
wherein the switch transistor has a control electrode being connected to the first sub-electrostatic ring of the each first electrostatic ring, a first electrode being connected to a corresponding gate line, and a second electrode being connected to the second sub-electrostatic ring of the each first electrostatic ring, and a first end of the electrostatic resistor is connected to a corresponding gate line, a second end of the electrostatic resistor is connected to the second sub-electrostatic ring of the each first electrostatic ring; and
wherein each of the second or third control components comprises: an electrostatic resistor, wherein a first end of the electrostatic resistor is connected to a corresponding data line or common electrode line, and a second end of the electrostatic resistor is connected to the second electrostatic ring.

14. A method for driving the display substrate according to claim 13, comprising the following steps:
each first sub-electrostatic ring loading a first control sub-voltage to the control electrodes of the switch transistors connected to the each first sub-electrostatic ring after the display panel is turned off, so as to turn on the switch transistors;
each second sub-electrostatic ring loading a second control sub-voltage to the second electrodes of the switch transistors connected to the each second sub-electrostatic ring and loading the second control sub-voltage to the second ends of the electrostatic resistors connected to the each second sub-electrostatic ring after the display panel is turned off, so as to turn on the electrostatic resistors.

15. A display panel comprising the display substrate according to claim 1.

16. A method for driving the display substrate according to claim 1, comprising the following steps:
 each of the first electrostatic rings loading a control voltage after the display panel is turned off, so as to turn on a corresponding first control component; and
 turning on the first corresponding control component to change a voltage on a corresponding gate line into a turn-on voltage after the display panel is turned off.

* * * * *